United States Patent [19]

Gaida et al.

[11] Patent Number: 4,540,550
[45] Date of Patent: Sep. 10, 1985

[54] APPARATUS FOR GROWING CRYSTALS

[75] Inventors: Walter E. Gaida, East Pittsburgh; Zoltan K. Kun, Churchill, both of Pa.

[73] Assignee: Westinghouse Electric Corp., Pittsburgh, Pa.

[21] Appl. No.: 437,779

[22] Filed: Oct. 29, 1982

[51] Int. Cl.³ .............................................. C30B 11/00
[52] U.S. Cl. ................................... 422/109; 422/245; 422/206; 422/240; 422/241; 156/616 R
[58] Field of Search .............. 422/109, 175, 206, 245, 422/240, 241; 156/616 R, 616 A, DIG. 73, DIG. 105; 165/61

[56] References Cited

U.S. PATENT DOCUMENTS

| | | | |
|---|---|---|---|
| 3,620,686 | 11/1971 | Pfann | 156/616 R |
| 3,653,432 | 4/1972 | Schmidt et al. | 165/61 |
| 3,759,310 | 9/1973 | Barrow | 156/616 R |
| 3,898,051 | 8/1975 | Schmid | 165/61 |
| 4,096,025 | 6/1978 | Caslavsky | 156/616 R |
| 4,146,567 | 3/1979 | Munits et al. | 156/616 R |
| 4,264,406 | 4/1981 | Halskaylo | 156/616 R |
| 4,412,577 | 11/1983 | Sallceld et al. | 156/616 R |
| 4,439,266 | 3/1984 | Gentile et al. | 156/DIG. 89 |

OTHER PUBLICATIONS

Kuwamoto, Mat. Res. Bull., vol. 17, pp. 63–68, 1982.

Primary Examiner—Hiram H. Bernstein
Attorney, Agent, or Firm—Thomas R. Trempus

[57] ABSTRACT

A method for growing large, shaped, oriented crystals and an apparatus for cooling the seed crystal so that a portion thereof remains solid throughout the crystal growth process. The critical and time consuming process of seeding crystals under continuous supervision is eliminated. The unmelted portion of the seed crystal is maintained at a temperature below its melting point through a seed temperature control apparatus which utilizes a pool of a substantially liquid metallic material as a heat transfer medium. The pool is contained in a reservoir formed in a thermal energy conductive base member in which the growth vessel is disposed.

7 Claims, 5 Drawing Figures

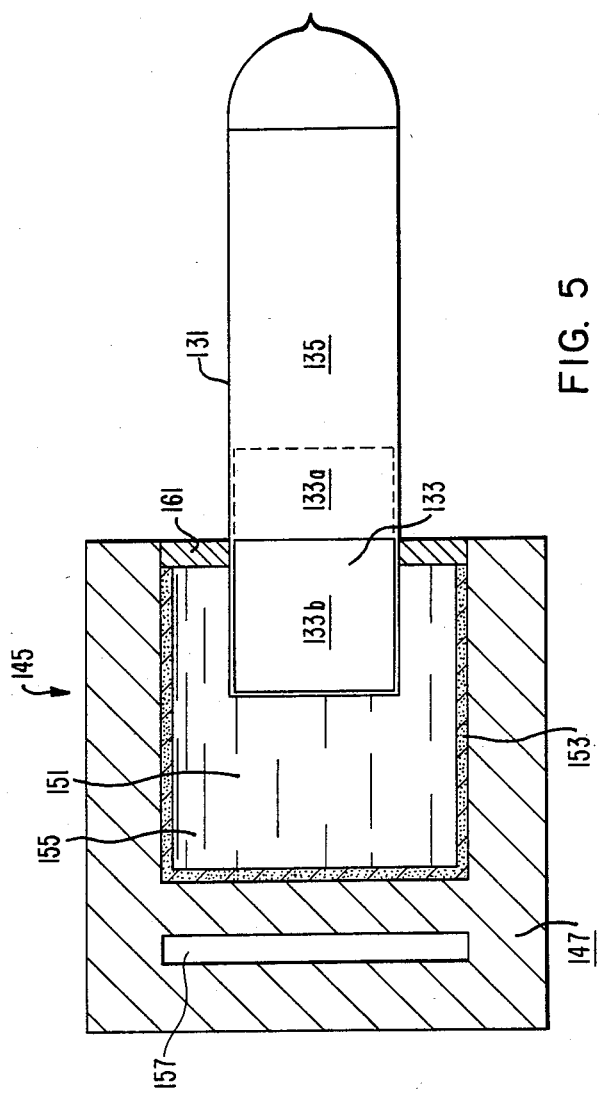

APPARATUS FOR GROWING CRYSTALS

BACKGROUND OF THE INVENTION

The invention relates to the growing of crystals. More particularly, the invention is directed to a method of orienting seed crystals and a method and apparatus for cooling the seed crystal during the crystal growth operation.

It is known in the art of growing single crystals to place a seed crystal in the bottom of a crystal growth vessel and to charge the material from which the crystal is to be grown into the vessel thus covering the seed crystal. The crystal growth material and a portion of the seed crystal are melted and allowed to cool, resulting in the nucleation of the growth material on the seed. It is of critical importance that only a portion of the seed crystal is melted with the growth material.

It is taught in U.S. Pat. No. 4,096,025 that a seed crystal can be oriented according to its growth planes in order to reduce thermal strain generated in the growth material by the heating and subsequent cooling cycles. Additionally, several methods for controlling the temperature of the seed crystal during crystal formation and thus the portion of the crystal which remains solid have been suggested. U.S. Pat. Nos. 3,653,432 and 3,898,051 both suggest active heat exchange systems which circulate an inert gas about the growth vessel in order to effect temperature control. U.S. Pat. No. 4,015,657 discloses an apparatus which uses a refrigerant to control the seed crystal temperature gradient. Finally, U.S. Pat. No. 4,264,406 provides a vessel support base with a circulating cooling fluid therein and a movable vessel shroud disposed between the vessel and the furnace with a circulating cooling fluid contained therein also.

The prior art temperature control systems are encumbered with certain liabilities which are eliminated by the present invention. For example, the use of circulating cooling fluid dictates the need for pumps, conduits and seals able to withstand the severe thermal conditions of the crystal growth process. The complexity and expense are self-evident in such prior art systems. Moreover, such systems often require a person to watch the seed melting and to physically adjust the seed crystal position in relation to the temperature profile of the furnace.

It is an object of this invention to provide a crystal growth process which is significantly simplified so that reliable blind seeding is possible.

It is also an object of this invention to provide a passive seed crystal temperature control method and apparatus.

It is still another object of this invention to provide a seed crystal orientation process which facilitates the production of crystal devices and greatly simplifies the manufacture of these devices.

SUMMARY OF THE INVENTION

The invention provides a method for growing large, shaped, crystallographically oriented crystals and an apparatus particularly useful with the aforesaid method. The method includes the steps of determining the crystal axes of a crystal and obtaining a seed crystal with known crystal faces therefrom. The seed crystal is disposed in a vessel with sides substantially parallel to the crystal faces of the seed crystal. A portion of the seed crystal as well as the growth material are melted. The remaining portion of the seed crystal is maintained at a temperature below the melting point thereof so that a fully oriented crystal is nucleated. An apparatus for maintaining the solid crystal seed portion within the aforedescribed temperature limit includes a base member with a reservoir therein of sufficient depth and cross-sectional dimensions to receive the portion of the growth vessel containing the solid seed crystal. A metallic material forms a substantially liquid pool throughout the crystal growing process. The liquid pool is in intimate contact with the crystal growth vessel to effect the transfer of thermal energy from the seed crystal and vessel.

BRIEF DESCRIPTION OF THE DRAWINGS

The above as well as other features and advantages of this invention will become apparent through consideration of the detailed description in connection with the accompanying drawings in which:

FIG. 5 is a cross-sectional elevational view of an alternative embodiment of the seed temperature control apparatus according to this invention.

DETAILED DESCRIPTION OF THE INVENTION

The invention relates to both a method and apparatus for cooling the seed during crystal growth. The economy of crystal growth is such that it is relatively cheaper to grow a large single crystal from which several individual devices can be manufactured, rather than to grow an individual crystal for each separate device. Moreover, the cost of crystal production and the cost of the device are reduced if the steps required to grow the crystal and the fabricate the device are minimized. The present invention addresses both of these factors.

For the purpose of illustrating a situation in which crystal production and device fabrication are significantly effected by this invention, the present process and apparatus are described in terms of the manufacture of acousto-optic devices, particularly an acousto-optic tunable filter crystal. By way of a brief explanation, an acousto-optic tunable filter operates through the interaction of high frequency acoustic waves with light waves in a suitable crystal. In certain birefringent optical materials, a propagating light beam can, under certain conditions be diffracted by interaction with an acoustic wave propagating in the same medium. Various optical materials have been developed for use in acousto-optic devices, these materials include: thallium-arsenic-selenide as described in U.S. Pat. No. 3,792,297, thallium-phosphorous-selenide per U.S. Pat. No. 3,929,970 and thallium-arsenic-sulfide per U.S. Pat. No. 3,799,659, all assigned to the assignee of the present invention and incorporated herein by reference. A complete description of the operation of an acousto-optic device can be had from the article "Automated Acousto-Optic Tunable Filter Infrared Analyzer", from the Proceedings of the SPIE—The International Society for Optical Engineering, Vol. 268, 1981, pp. 160-166.

Figure 1:
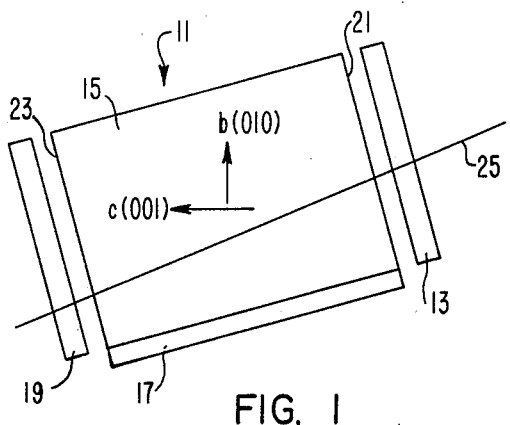
FIG. 1 is a schematical representation of a single crystal acousto-optic, device.

In FIG. 1, an acousto-optic tunable filter, generally indicated by the reference character 11 is seen in top view and includes an input polarizer 13, an optical crystal 15 with a transducer 17 bonded thereto and an output polarizer 19. The crystal 15 is a thallium-arsenic-selenide ($Tl_3AsSe_3$) crystal (TAS crystal). The crystal has an input optical face 21 and an output optical face 23. FIG. 1 schematically shows the crystal face which contains the crystalline b-c axes. The optical beam 25 is typically propagated at an angle to the crystalographic c axis determined by the specific application of the filter.

It has been the practice in the fabrication of an acousto-optic device, that the crystallographic axes of a crystal block are located from X-ray laue photographs or any other convenient method. A rectangular block is then cut from this crystal such that optical faces are accurately oriented for filter requirements vis-a-vis the crystallographic axes. Such a practice has required a significant level of handling of the crystal block: X-ray orientation, followed by cutting, grinding and polishing.

Figure 2:
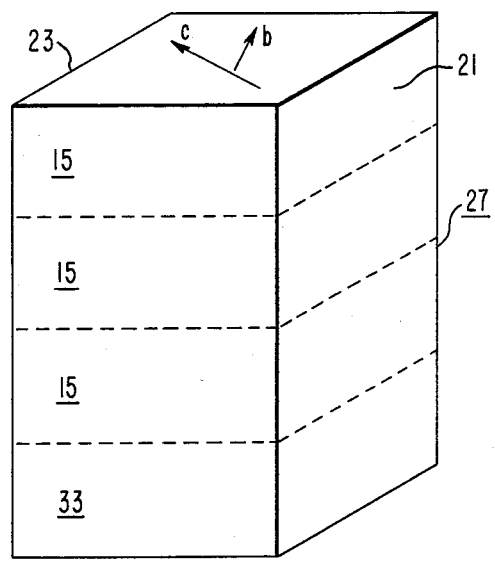
FIG. 2 is a schematical representation of a large, shaped single crystal grown according to this invention with the crystal axis thereof illustrated.

One aspect of the present invention is to provide a fully oriented seed crystal from which a large, shaped single crystal is grown. Consequently, the crystal need not be oriented by X-ray after crystal growth in order to determine how it should be cut for acousto-optic application. As shown in FIG. 2, the only cutting involved is the cutting up of the large crystal 27 into device-size rectangular sections 15. The optical faces 21 and 23 of each crystal 15 are polished to achieve an optical quality surface and as indicated above, may be set at an angle, depending on the specific crystal application.

The growth vessel utilized in this process is rectangular in cross section with planar faces to assure that the faces on the growing crystal follow the faces on the fully oriented seed crystal. The vessel may be of the type in which a seed pocket or necked down portion of the vessel provides a seed crystal chamber which is smaller in cross-section than the upper portion of the vessel. It is preferred that a rectangular vessel of substantially constant cross section be used so that a seed crystal cut from a previously grown crystal block can be deposited in the bottom of the vessel.

Figure 3:
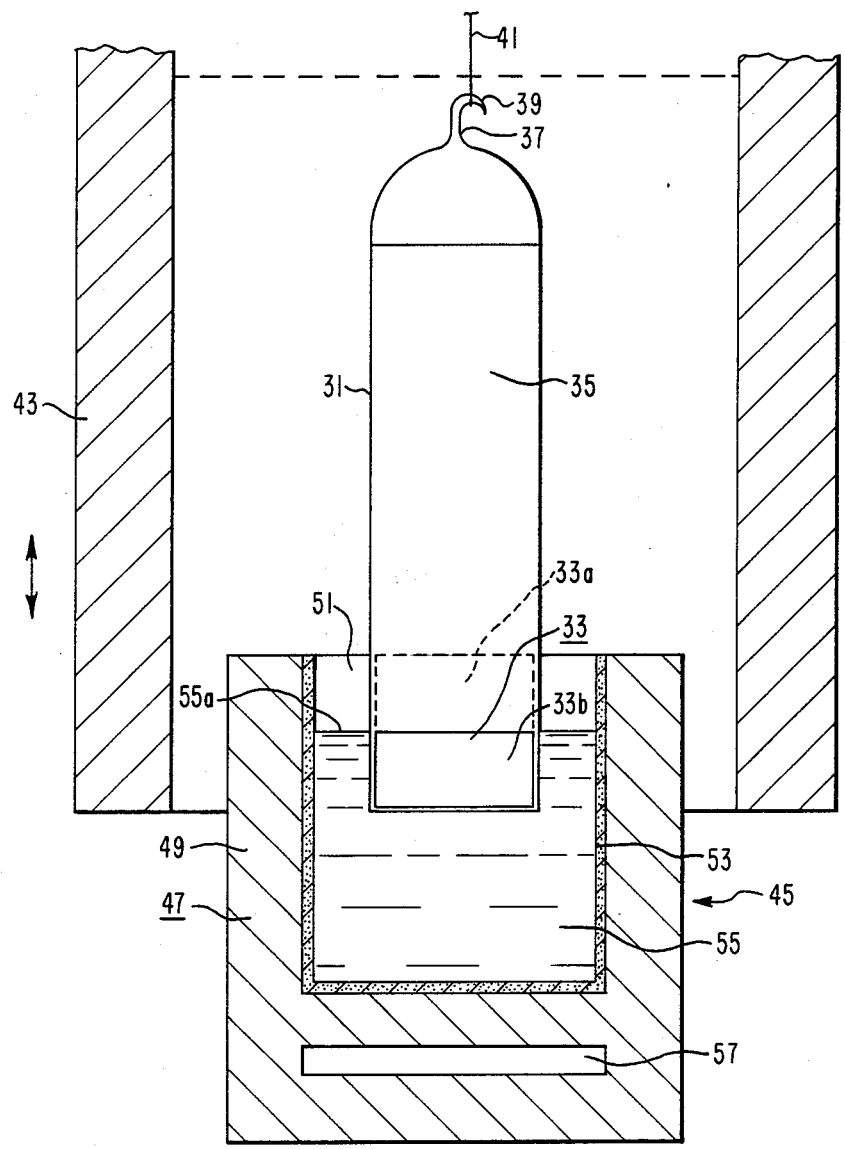
FIG. 3 is a cross-sectional elevational view of the seed temperature control apparatus of this invention.

The large single crystal of TAS is grown from polycrystalline $Tl_3AsSe_3$ in an evacuated and sealed quartz vessel 31 as shown in FIG. 3. The TAS seed crystal 33 is placed in the bottom of the vessel 31. The crystal growth material 35 is charged into the vessel 31 after which the vessel is evacuated and the top of the vessel sealed as at 37. Means such as a hook 39 are provided in order to suspend the vessel 31 by a wire 41 within the furnace 43. The furnace 43, schematically represented herein, is typically a travelling furnace, movable vertically relative to the suspended vessel 31.

A seed crystal temperature control apparatus according to this invention is disposed below the furnace 43 and generally indicated by the reference character 45. The apparatus 45 comprises a base portion 47 with an upper portion 49 defining a reservoir 51 therein. The reservoir is of sufficient depth and cross-sectional dimension to receive therein at least the portion of the vessel 31 in which the seed crystal 33 is disposed. It is preferred that the reservoir 51 have an interior lining 53 therein. A metallic material (or alloy) 55, disposed in the reservoir 51, forms a substantially liquid pool which is in intimate contact with the crystal growth vessel 31 throughout the crystal growing process. It is preferred that the lining 53 consist of a material, such as graphite to inhibit reactions between the base and the metallic material.

The metallic material has the property of good thermal conductivity in the liquid state. Additionally, the metallic material remains in the liquid state at a temperature lower than the liquefaction temperature of the crystal seed. It is preferred that the liquid material have a low vapor pressure at temperatures above its melting point. An ideal metallic-material characterized by the above identified properties is gallium (Ga) which melts at 27° C. and has a low vapor pressure of less than about $10^{-10}$ atm. at the approximate temperature at which it is employed. Moreover molten gallium displays a high level of thermal conductivity; approximately 0.8 w/cm°k. Other metallic materials having such suitable properties include, indium, bismuth, tin and alloys of these elements. Gallium, because of its low melting point, remains in a liquid state under ambient conditions. As a result, it is preferred that gallium be used as the metallic material. However, in an alternative embodiment of this invention, a heater means, schematically illustrated at 57 can be provided to heat the metallic material to a temperature above its melting point. The temperature at which the heater means 57 is operated is guided by the same parameters which dictate the selection of the metallic material: the melting point of the seed crystal and the melting point of the metallic material. The melting point of the metallic material must always be lower than the melting point of the seed crystal because the molten bath of metallic material functions as a heat sink which cools a portion of the seed crystal below its melting point. The use of a heater means 57 permits the use of a metallic material having a melting point which although lower than that of the seed crystal is higher than the ambient. (For the purpose of this description, ambient temperature is understood to mean the lowest temperature at which gallium remains molten).

In FIG. 3, the upper portion 33a of the seed crystal is shown in dash-dot lines, while the lower portion 33b of the seed crystal is shown in full. During the crystal growth process, single crystal growth begins by melting the polycrystalline TAS 35 and part of the seed crystal 33. The size of the seed crystal that remains solid is critical. If too little or too much of the seed crystal melts, the desired crystallographic orientation does not occur. The apparatus of this invention controls the aforedescribed melting of the seed crystal through the efficient and effective transfer of heat from the seed crystal to the ambient environment. The heat transfer or heat sinking of a predetermined portion of the seed crystal; i.e. 33b, while allowing the remaining portion of the seed crystal 33a to melt is effected through the submergence of a portion of the vessel 31 into the molten metallic material 55. Usually seeding is achieved with certainty when the surface 55a of the molten metallic material is at the half way mark along the height of the seed crystal (indicated herein by the interface of seed crystal portions 33a and 33b). It should be appreciated that the method and apparatus of this invention eliminates the need to position the seed crystal accurately in relation to the temperature profile of the furnace. The present technique permits "blind" seeding, that is; it does not require a person to monitor the seed crystal melting process and to adjust the seed crystal position in relation to the temperature profile of the furnace.

Figure 4:
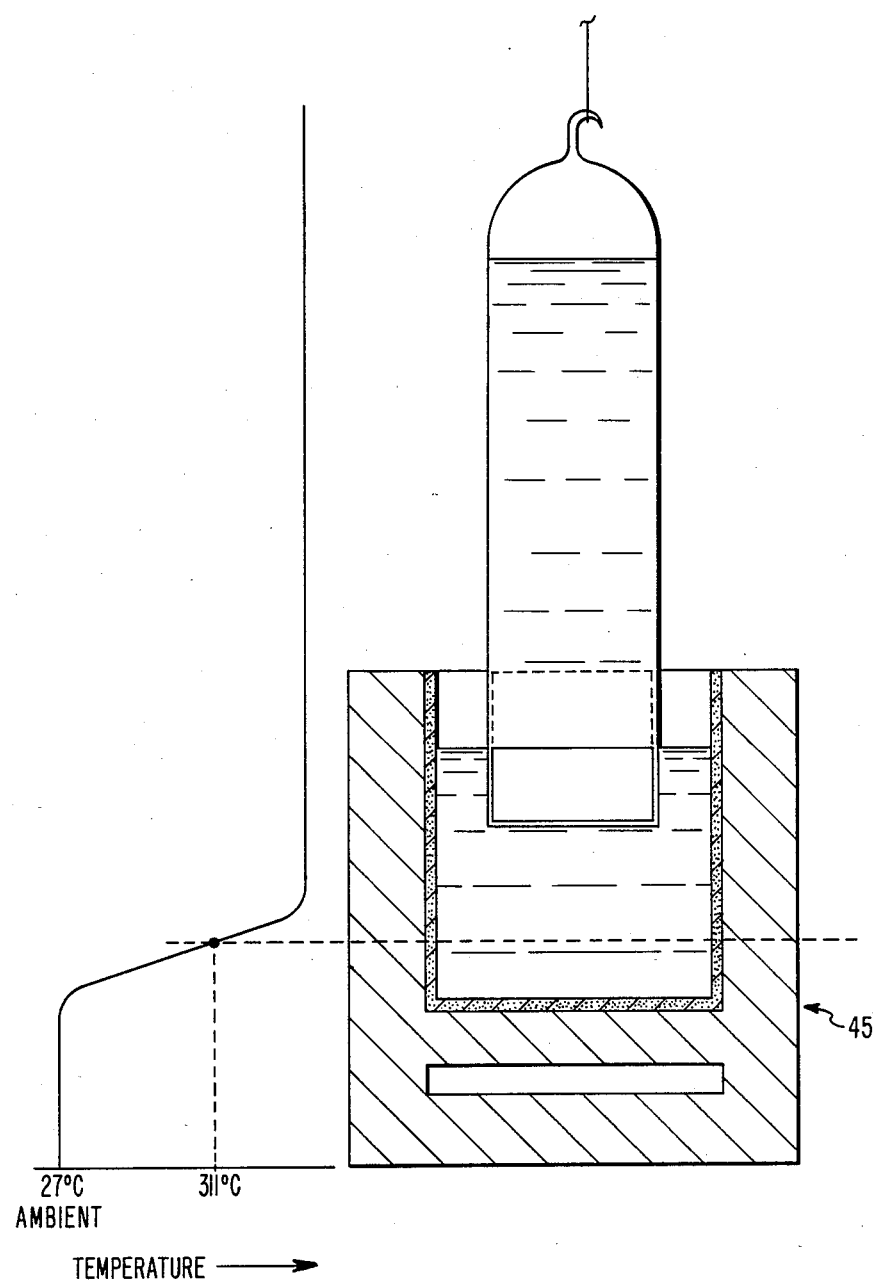
FIG. 4 is a diagrammatic representation of the process and apparatus of this invention demonstrating the furnace temperature profile during seed crystal melting process.

FIG. 4 shows the furnace temperature profile of the crystal seed melting portion of the process in relation to the vessel 35 and the seed crystal temperature control apparatus 45. In the TAS crystal growth process the seed crystal melts at approximately 311° C. The entire seed crystal is maintained at a position within the temperature profile of the furnace that would, under other circumstances, cause the seed to melt. However, through the process and apparatus described herein, the amount of the seed crystal which melts (33a) is controlled by the position of the seed crystal containing vessel relative to the level of the molten metallic material 55. The portion of the seed crystal (33b) submerged in the molten metallic material 55 is maintained at a temperature lower than its melting point through the heat transfer process described above. The previously critical positioning of the seed crystal relative to the temperature profile of the furnace is eliminated with this technique. It is to be appreciated that the melting point of the material of interest can be established in the furnace at any point at or below the desired seed liquid-solid interface. The furnace profile illustrated herein is arbitrary and the furnace profile can be modified.

Another distinct advantage obtained through the use of the seed temperature control apparatus is overcoming the hazard of cracking of the vessel 31 during seeding. Without the use of the temperature control apparatus 55, the solid charge 35 within the vessel 31 would be melted gradually, beginning at the top of the vessel. The molten charge penetrates between the vessel wall and the seed crystal where the molten material cools and hardens, thus wedging therebetween. As more of the vessel is introduced to the temperature required for melting the charge, the cooled, wedged material is heated thereby expanding and cracking the vessel 31. This problem is substantially eliminated by the seed cooling apparatus and method described herein.

Once seeding is established, crystal growth is effected by gradually cooling the crystal vessel 31 beginning at the bottom of the vessel and working upwardly. Typically this cooling is accomplished by controlling the temperature profile of the furnace. As shown in FIG. 3, the travelling furnace 43 is elevated relative to the vessel 31 to effect the required temperature profile control. During this growth process, the solid-liquid interface within the vessel 31 should be either flat or convex when viewed from the liquid side. The shape of this interface is controlled by the heat input and heat loss of the crystallizing material in the vessel 31. For a large crystal, a considerable amount of heat has to be removed axially from the solidifying material to assure that a concave interface does not form (or conversely, a significant amount of heat is transmitted into the capsule radially). The parameters which control the heat distribution within the vessel are the thermal conductivity of the solidified material and the heat transfer between the growth vessel and the ambient. Obviously, the thermal conductivity of the solidified material cannot be changed. However, the heat transfer between the growth vessel and the ambient can be improved and this is accomplished as follows: increasing the cross section of the seed crystal and effectively transferring heat from the crystal seed end of the vessel. Accordingly it is preferred that a large seed crystal cut from a previously grown crystal as described above be employed. The large cross-sectional area of the seed crystal in the vessel 31 presented to the molten metallic material 55 facilitates the axial heat transfer from the solidifying crystal to the seed temperature control apparatus 45. The molten metallic material in the reservoir insures good thermal conductivity across the crystal growth vessel 31 and the seed temperature control apparatus interface. When both of the aforedescribed methods are employed, a convex or flat liquid-solid interface within the vessel 31 is obtained. The speed at which crystal growth takes place, i.e. the rate at which the crystal material 35 is cooled and solidified, can be accelerated. The limit to this acceleration being the disposition of the liquid-solid interface, that is; as the interface just becomes flat, the maximum growth rate for the crystal has been achieved.

The description up to this point has related to vertical crystal growth. The seed crystal orientation and crystal growth technique as well as the seed temperature control apparatus of this invention can also be utilized in conjuction with a horizontal growth vessel. Turning to FIG. 5, an alternative embodiment of the invention, a seed temperature control apparatus for a horizontal growth vessel is indicated by the reference character 145. The apparatus 145 comprises a base portion 147 having a cavity therein defining a reservoir 151. The reservoir is of sufficient depth and cross-sectional dimension to receive therein at least a portion of the seed crystal bearing section of the horizontal growth vessel 131. The reservoir 151 can include a protective lining 153. A flange-like sealing member 161 is disposed about the open end of the reservoir 151 and is adapted to closely receive therethrough the vessel 131. A heating means 157 can be provided in the base 147.

The reservoir 151 contains a molten metallic material 155 as previously described. It is preferred that the molten metallic material be gallium because in addition to its desirable properties described elsewhere herein, molten gallium has sufficient surface tension to inhibit leakage between the vessel 131 and the sealing means 161. The surface tension of the gallium substantially retains the molten material within the reservoir. The seed crystal portion 133a and crystal growth material 135 are melted and cooled in a crystal growth cycle as previously described.

What has been described is a method and apparatus for growing large, shaped single crystals. Athough the present invention has been described with a certain degree of particularity, it is understood that the present disclosure has utilized the growth of a TAS crystal by way of example and that numerous changes may be made in details without departing from the spirit and scope of this invention.

What is claimed is:

1. A temperature control apparatus for maintaining a portion of a seed crystal at a predetermined temperature which is less than the liquefaction temperature of the seed crystal throughout the crystal growing process, said temperature control apparatus being adapted to receive therein a crystal growth vessel with the seed crystal disposed therein for use in combination with a travelling furnace adapted to be movable relative to the crystal growth vessel disposed in said temperature control apparatus, said furnace defining a chamber of a predetermined cross-sectional dimension, in which chamber a temperature profile greater than the liquefaction temperature of the seed crystal is established, said temperature control apparatus comprising;

a base dimensioned to be received with the chamber defined by the travelling furnace, said base having a reservoir therein, said reservoir having a depth and cross-sectional dimension sufficient to receive therein at least a portion of the seed crystal containing section of the crystal growth vessel; and a metallic material disposed in said reservoir and forming therein a substantially liquid pool at a temperature which is less than the seed crystal liquefaction temperature throughout the crystal growing process in intimate contact with the crystal growth vessel section, said metallic material having good thermal conductivity in the liquid state and the remaining in the liquid state at a temperature lower than the liquefaction temperature of the seed crystal wherein the portion of the seed crystal containing section of the crystal growth vessel disposed in said metallic material is at a temperature lower than its melting point independent of the travelling furnace temperature profile with respect to said base.

2. An apparatus for seed crystal temperature control according to claim 1 wherein the metallic material disposed in the reservoir is gallium.

3. An apparatus for seed crystal temperature control according to claim 1 wherein means for heating the metallic material are in thermal contact therewith, said heating means maintaining said metallic material in a substantially liquid state.

4. An apparatus for seed crystal temperature control according to claim 1 wherein the base consists of a material characterized by good thermal conductivity, whereby the metallic material and the base transfer heat from the seed crystal in the portion of the vessel disposed in said metallic material.

5. The apparatus for seed crystal temperature control according to claim 4 wherein the base is copper and the reservoir has a graphite lining means therein to inhibit reactions between the metallic material and the base.

6. An apparatus for seed crystal temperature control according to claim 1 including sealing means disposed about the open end of the reservoir adapted to closely receive therethrough the crystal growth vessel.

7. A temperature control apparatus for maintaining a portion of a seed crystal at a predetermined temperature which is less than the liquefaction temperature of the seed crystal throughout the crystal growing process, and temperature control apparatus being adapted to receive therein a crystal growth vessel with the seed crystal disposed therein and for use in combination with a travelling furnace adapted to be movable relative to the crystal growth vessel disposed in said temperature control apparatus, said furnace defining a chamber of a predetermined cross-sectional dimension, in which chamber a temperature profile greater than the liquefaction temperature of the seed crystal is established, said temperature control apparatus comprising;

a base dimensioned to be received with the chamber defined by the travelling furnace, said base having a reservoir therein, said reservoir having a depth and cross-sectional dimension sufficient to receive therein at least a portion of the seed crystal containing section of the crystal growth vessel;

a metallic material disposed in said reservoir and forming therein a substantially liquid pool at a temperature which is less than the seed crystal liquefaction temperature throughout the crystal growing process in intimate contact with the crystal growth vessel section, and metallic material having good thermal conductivity in the liquid state; and means for heating the metallic material in thermal contact therewith, said heating means being disposed in said base for maintaining said metallic material in a substantially liquid state wherein the portion of the seed crystal containing section of the crystal growth vessel disposed in said metallic material is at a temperature lower than its melting point independent of the travelling furnace temperature profile with respect to said base.

* * * * *